(12) United States Patent
Vissers (10) Patent No.: US 10,336,480 B2
(45) Date of Patent: Jul. 2, 2019

(54) AIR-GUIDED TAPE-AND-REEL SYSTEM AND METHOD

(71) Applicant: Nexperia B.V., AB Nijmegen (NL)

(72) Inventor: Antonius Johannes Hendrikus Vissers, BT Den Dungen (NL)

(73) Assignee: Nexperia B.V., Nijmegen (NL)

( * ) Notice: Subject to any disclaimer, the term of this patent is extended or adjusted under 35 U.S.C. 154(b) by 589 days.

(21) Appl. No.: 14/743,038

(22) Filed: Jun. 18, 2015

(65) Prior Publication Data

US 2016/0368639 A1    Dec. 22, 2016

(51) Int. Cl.
| | |
|---|---|
| *B65B 7/16* | (2006.01) |
| *B65B 9/04* | (2006.01) |
| *B65B 15/04* | (2006.01) |
| *B65B 41/02* | (2006.01) |
| *B65B 41/16* | (2006.01) |
| *B65B 41/18* | (2006.01) |
| *B65B 51/16* | (2006.01) |
| *B65H 23/24* | (2006.01) |
| *H05K 13/00* | (2006.01) |

(52) U.S. Cl.
CPC .............. *B65B 7/164* (2013.01); *B65B 9/045* (2013.01); *B65B 15/04* (2013.01); *B65B 41/02* (2013.01); *B65B 41/16* (2013.01); *B65B 41/18* (2013.01); *B65B 51/16* (2013.01); *B65H 23/24* (2013.01); *H05K 13/003* (2013.01); *H05K 13/0084* (2013.01)

(58) Field of Classification Search
CPC B65B 5/04; B65B 7/162; B65B 7/164; B65B 9/045; B65B 15/04; B65B 41/02; B65B 41/12; B65B 41/16; B65B 41/18; B65H 20/24; B65H 20/32; B65H 23/24; B65H 2408/215; H05K 13/003; H05K 13/0084
USPC ...... 53/453, 467, 471, 559, 246, 281, 329.4; 226/97.2; 242/417.1, 420.6
See application file for complete search history.

(56) References Cited

U.S. PATENT DOCUMENTS

| | | | |
|---|---|---|---|
| 3,878,979 A * | 4/1975 | Cristiani ................ | B65H 19/14 226/11 |
| 4,575,995 A * | 3/1986 | Tabuchi et al. .... | H05K 13/0038 53/453 |
| 4,753,061 A * | 6/1988 | Braden et al. ..... | H05K 13/0084 53/281 |

(Continued)

FOREIGN PATENT DOCUMENTS

| | | | | |
|---|---|---|---|---|
| DE | 3936038 A1 * | 5/1991 | ............. | B65H 23/24 |
| EP | 0690017 A2 * | 1/1996 | ............. | B65H 23/24 |

(Continued)

*Primary Examiner* — Stephen F. Gerrity
(74) *Attorney, Agent, or Firm* — Ohlandt, Greeley, Ruggiero & Perle, L.L.P.

(57) ABSTRACT

A tape-and-reel system for processing components is disclosed. In the embodiment, the tape-and-reel system includes a first carrier tape reel for holding unloaded carrier tape, a component loading system for loading components into pockets of the unloaded carrier tape, an air-guided cover tape feeder through which cover tape travels, an alignment tool for guiding the cover tape into alignment with the loaded carrier tape and adhering the cover tape to the loaded carrier tape to secure the components into the loaded carrier tape, and a second carrier tape reel for holding the loaded carrier tape.

10 Claims, 10 Drawing Sheets

(56) References Cited

U.S. PATENT DOCUMENTS

| | | | | |
|---|---|---|---|---|
| 5,191,693 | A | * | 3/1993 | Umetsu .............. H05K 13/0417 156/324 |
| 5,501,412 | A | * | 3/1996 | McAleavey ......... B65H 23/245 226/118.5 |
| 6,095,391 | A | * | 8/2000 | Fiske et al. ............ B65H 23/24 226/113 |
| 6,101,790 | A | * | 8/2000 | Mori et al. ............. B65B 15/04 206/714 |
| 6,481,187 | B1 | * | 11/2002 | Behnke et al. ......... B65B 9/045 53/250 |
| 7,987,653 | B2 | * | 8/2011 | Gregerson et al. ......................... H05K 13/0084 53/281 |
| 2002/0100257 | A1 | * | 8/2002 | Nakamura et al. ..... B65B 9/045 53/559 |
| 2003/0079444 | A1 | * | 5/2003 | Behnke .................. B65B 7/164 53/467 |
| 2003/0079446 | A1 | * | 5/2003 | Behnke .................. B65B 9/045 53/473 |
| 2005/0132664 | A1 | * | 6/2005 | Bettini ................... B65B 41/18 53/64 |
| 2006/0091181 | A1 | | 5/2006 | Eder et al. |
| 2014/0049587 | A1 | | 2/2014 | Rieck et al. |

FOREIGN PATENT DOCUMENTS

| | | | |
|---|---|---|---|
| EP | 0711712 A1 | 5/1996 | |
| EP | 1362814 A1 * | 11/2003 | ............. B65H 20/32 |
| JP | 58011453 A * | 1/1983 | ............. B65H 20/24 |
| NL | 1013194 C2 * | 4/2001 | ............. B65H 23/24 |
| WO | WO 2009120614 A1 * | 10/2009 | ............. B65B 9/045 |

\* cited by examiner

AIR-GUIDED TAPE-AND-REEL SYSTEM AND METHOD

BACKGROUND

Automated assembly systems that utilize pick-and-place equipment often times utilize components that are packaged using tape-and-reel packing systems. Tape-and-reel packing systems commonly utilize a carrier tape that is reeled up onto a terminal reel. Typically, chips or other components are loaded into the carrier tape and secured with cover tape before being reeled up onto a terminal reel. In the case where the chips or components are for very small products (e.g. 0.4×0.2 mm chips), high position accuracy of the carrier tape within the taping system is needed to ensure that the chips or components are properly loaded into the carrier tape and to ensure that the cover tape is accurately applied over the chips or components that are loaded into the carrier tape. Because high position accuracy is needed, even very subtle mechanical disturbances and friction can introduce error into a tape-and-reel packaging system.

SUMMARY

In an embodiment, a tape-and-reel system for processing components is disclosed. In the embodiment, the tape-and-reel system for processing components is disclosed. In the embodiment, the tape-and-reel system includes a first carrier tape reel for holding unloaded carrier tape, a component loading system for loading components into pockets of the unloaded carrier tape, an air-guided cover tape feeder through which cover tape travels, an alignment tool for guiding the cover tape into alignment with the loaded carrier tape and adhering the cover tape to the loaded carrier tape to secure the components into the loaded carrier tape, and a second carrier tape reel for holding the loaded carrier tape.

In a second embodiment, a method for processing components using a tape-and-reel system is disclosed. In the embodiment, the method involves feeding carrier tape from a first carrier tape reel holding unloaded carrier tape into a component loading system, loading components into pockets of the carrier tape, feeding cover tape through an air-guided cover tape feeder, feeding the loaded carrier tape and the cover tape to an alignment tool, aligning the cover tape with the loaded carrier tape to secure the components into the loaded carrier tape, and reeling the loaded carrier tape onto a second carrier tape reel.

In a third embodiment, a cover tape feeder is disclosed. In an embodiment, the cover tape feeder includes a rear panel, at least two spacers coupled to the rear panel, a cover plate having openings, and an optical sensor system positioned along the rear panel and behind the openings in the cover plate wherein, the cover plate is separated from the rear panel by the at least two spacers such that cover tape can pass over the spacers between the rear panel and the cover plate and wherein, the at least two spacers are spaced horizontally apart to create a vertical channel into which pressurized fluid can be injected perpendicular to a major surface of the cover tape.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Modern automated circuit assembly systems can pick and place thousands of components per hour with very high accuracy. The very high accuracy is due, in part, to the method by which components are delivered or loaded into an automated circuit assembly system. The delivery method typically relies on uniformly oriented and indexed chips that can be delivered at high speeds. One way to achieve uniformity is through the use of tape-and-reel packaging in which components are uniformly placed into specifically designed pockets in carrier tape and then secured by mechanically applied cover tape. The secured carrier tape is then reeled up for distribution and subsequent use in an automated circuit assembly system.

Figure 1A:
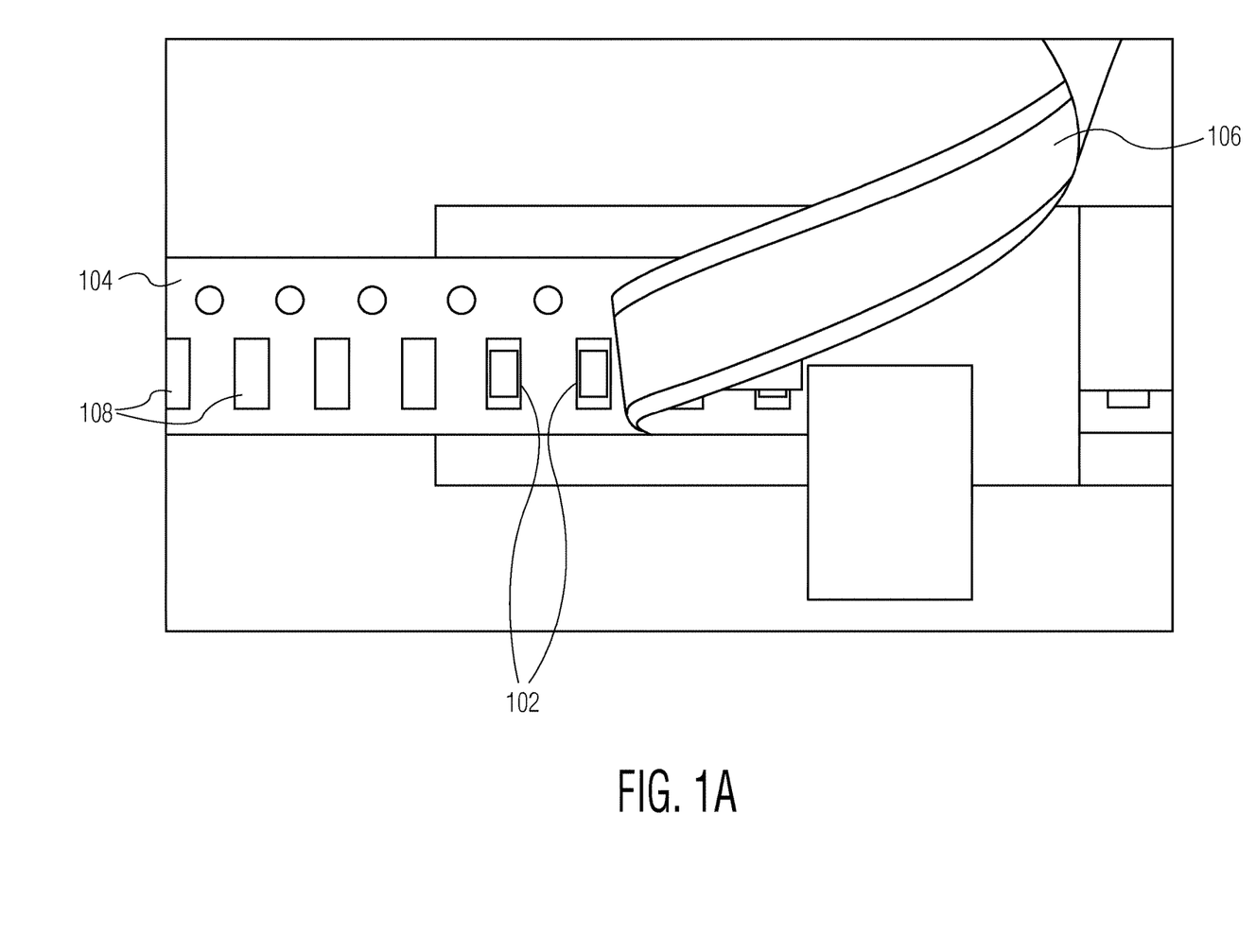
FIG. 1A depicts components secured in carrier tape by cover tape.

FIG. 1A depicts components 102 secured in carrier tape 104 by cover tape 106. In FIG. 1A, the components are taped into pockets 108 embossed into the carrier tape. Carrier tape is available in many different widths (e.g., 8 mm and 12 mm wide tape) and serves as protection for the components against physical damage, such as damage to leads on the components, as well as electrical damage, such as electrostatic discharge. Many types of cover tape are commercially available and have adhesive strength that ranges from, for example, 10 g to 130 g of peel back strength that can be activated by heat or pressure and optionally reduced by UV exposure. For example, once the cover tape has been aligned with the carrier tape, the aligned tapes are heated until the cover tape adheres to the carrier tape. Then, to remove the cover tape, the adhered tapes are exposed to UV light until the cover tape can be easily peeled back from the carrier tape.

Figure 1B:
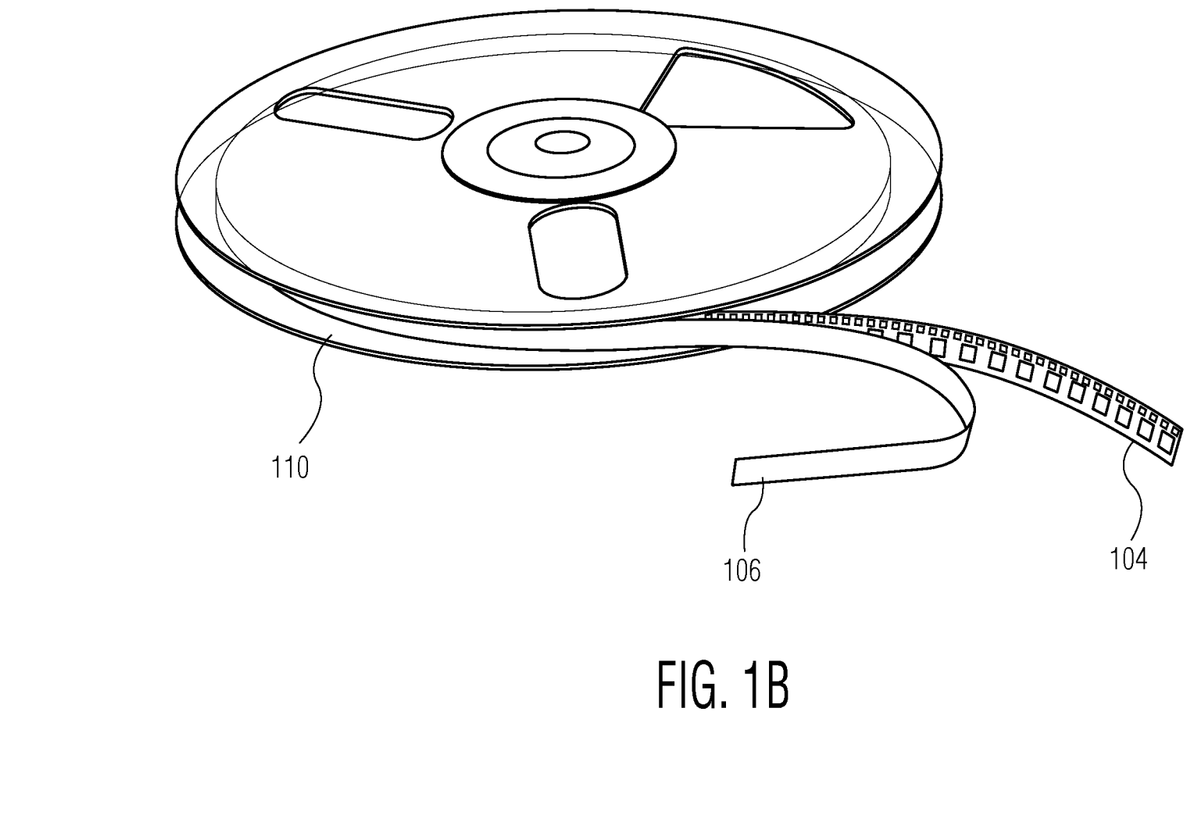
FIG. 1B depicts a reel of the components secured in carrier tape by cover tape.

FIG. 1B depicts a reel 110 of components secured in carrier tape 104 by cover tape 106. Typically, once the components have been secured in the carrier tape as described with reference to FIG. 1A, the carrier tape is reeled up for distribution. The reel can vary in size depending on, for example, the size of the carrier tape needed due to the size of the components, the number of components ordered, or the mechanical requirements of the consumer (e.g., the consumer requires 10" reels for use in the consumer's automated assembly system).

Although components for very small products (e.g., components measuring 0.4×0.2 mm) are often loaded into carrier tape at rapid speeds, which can reduce accuracy of loading, tape-and-reel packing systems still need very accurate loading in order to ensure good tape-in of components into the carrier tape. For example, if the pockets of the carrier tape become misaligned by even 10 µm, then components may be placed partially between the pockets resulting in poor tape-in and a high probably that components will be damaged before placement by an assembly system. Mechanical tension systems typically use mechanisms such as rollers, levers, and springs for guiding and maintaining tension on the cover tape (herein referred to as mechanical cover tape feeders). Often, these mechanisms introduce force variations, movement, and friction that can produce alignment errors (e.g., alignment variance in excess of 10 µm between the carrier tape and the packing system), by holding the cover tape at higher tension than is desired due to physical limitations of the mechanisms. For example, if a tape-and-reel system that can absorb no more than 1 mN of tension force uses 5 mN of tension force to keep the cover tape taut and to overcome friction when advancing the cover tape through the rollers, levers, and springs of the tension system, then the unabsorbed tension force (4 mN) may cause mechanical disturbances, which can negatively impact the accuracy of the tape-and-reel system. Accordingly, it is desirable to reduce the impact of any movement or friction that may affect the accuracy of the tape-and-reel system.

In an embodiment, a tape-and-reel system for processing components is disclosed. In the embodiment, the tape-and-reel system includes a first carrier tape reel for holding unloaded carrier tape, a component loading system for loading components into pockets of the unloaded carrier tape, an air-guided cover tape feeder through which cover tape travels, an alignment tool for guiding the cover tape into alignment with the loaded carrier tape and adhering the cover tape to the loaded carrier tape to secure the components into the loaded carrier tape, and a second carrier tape reel for holding the loaded carrier tape. In an embodiment, the air-guided cover tape feeder uses externally pressurized air output via a pressurized fluid outlet of a pressurized fluid interface to apply pressure to the feed of cover tape and, in so doing, creates an air buffer for absorbing tension. For example, a tape-and-reel system using an air-guided cover tape feeder may be able to absorb 5 mN of tension force and, therefore, will likely not subject the system to as much mechanical disturbance. Accordingly, the accuracy of the tape-and-reel system is less affected by mechanical disturbances because tension force can be absorbed and, thus, accuracy can be more easily maintained by the tape-and-reel system.

Figure 2:
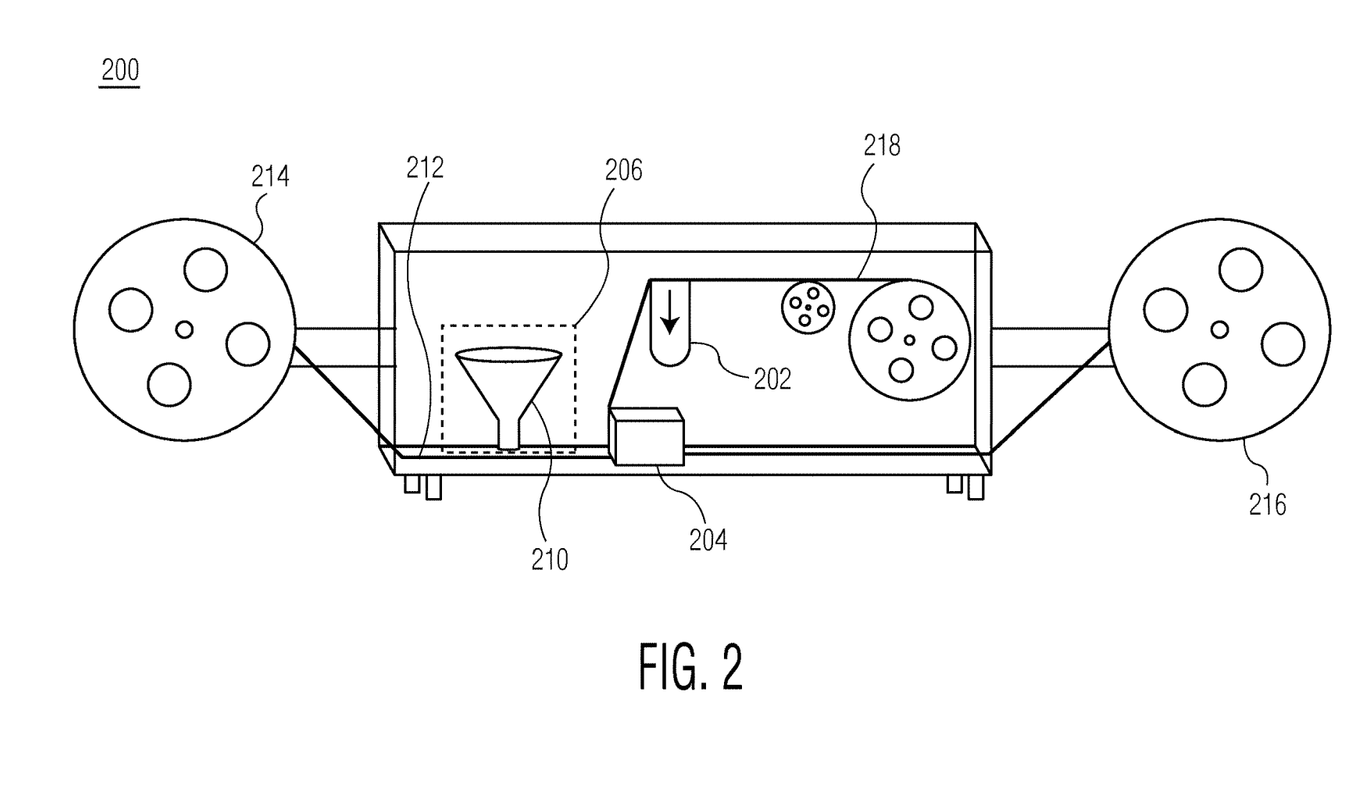
FIG. 2 depicts a tape-and-reel system that utilizes an air-guided cover tape feeder in accordance with an embodiment of the invention.

FIG. 2 depicts a tape-and-reel system 200 that utilizes an air-guided cover tape feeder in accordance with an embodiment of the invention. The system includes a first carrier tape reel 214 for holding unloaded carrier tape (hereinafter referred to as the source reel), a component loading system 206, an air-guided cover tape feeder 202, an alignment tool 204, and a second carrier tape reel for holding loaded carrier tape (hereinafter referred to as the terminal reel). In the embodiment of FIG. 2, the component loading system includes a bowl 210 that holds components to be loaded into the pockets of the unloaded carrier tape and a channel 212 through which the components are loaded. In other embodiments, the component loading system can be other component loading systems such as a linear feed system. Although and example configuration of the system is shown, other configurations that utilize an air-guided cover tape feeder are possible.

In operation, components are loaded into carrier tape, which begins reeled on the source reel, and the loaded carrier tape is then fed though the alignment tool. In an embodiment, the alignment tool aligns the edges of the carrier tape with edges of cover tape 218 (as described below) and secures the loaded components in the carrier tape using a roller that adheres the cover tape to the carrier tape. Once the cover tape is adhered to the carrier tape and the components are secured, the carrier tape (including the components) is reeled up onto the terminal reel. In an embodiment, the carrier tape is reeled up onto the terminal reel in a direction that is opposite to the direction in which the carrier tape will be unreeled by an automated circuit assembly system using the terminal reel. For example, if an automated circuit assembly system unreels loaded carrier tape in a counterclockwise direction, then the carrier tape will be reeled up onto the terminal reel in a clockwise direction.

Figure 3:
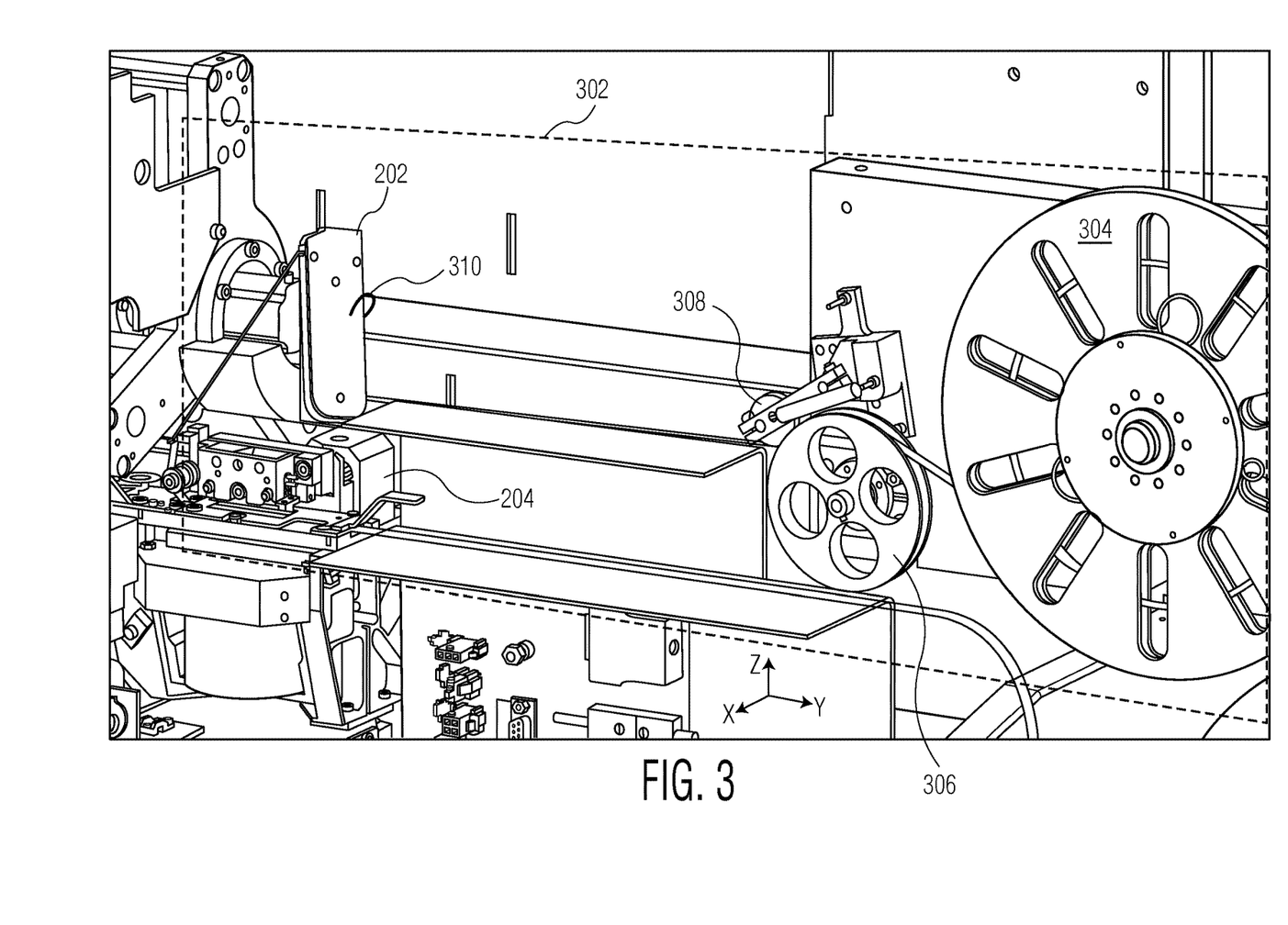
FIG. 3 is a perspective view of the tape-and-reel system of FIG. 2.

FIG. 3 is a perspective view of the tape-and-reel system of FIG. 2. The air-guided cover tape feeder 202 is part of a cover tape reel system 302, which further includes a cover tape reel 304, a guide reel 306, and a driven roller 308. Initially, the cover tape is driven by the driven roller from the cover tape reel, over the guide reel, and into a channel 310 formed by the air-guided cover tape feeder. The cover tape is then fed through the channel formed by the air-guided cover tape feeder and into the alignment tool 204 of the carrier tape reel system, where the cover tape is aligned with and adhered to the carrier tape before being reeled up onto the terminal reel (not shown) of the tape-and-reel system.

Figure 4A:
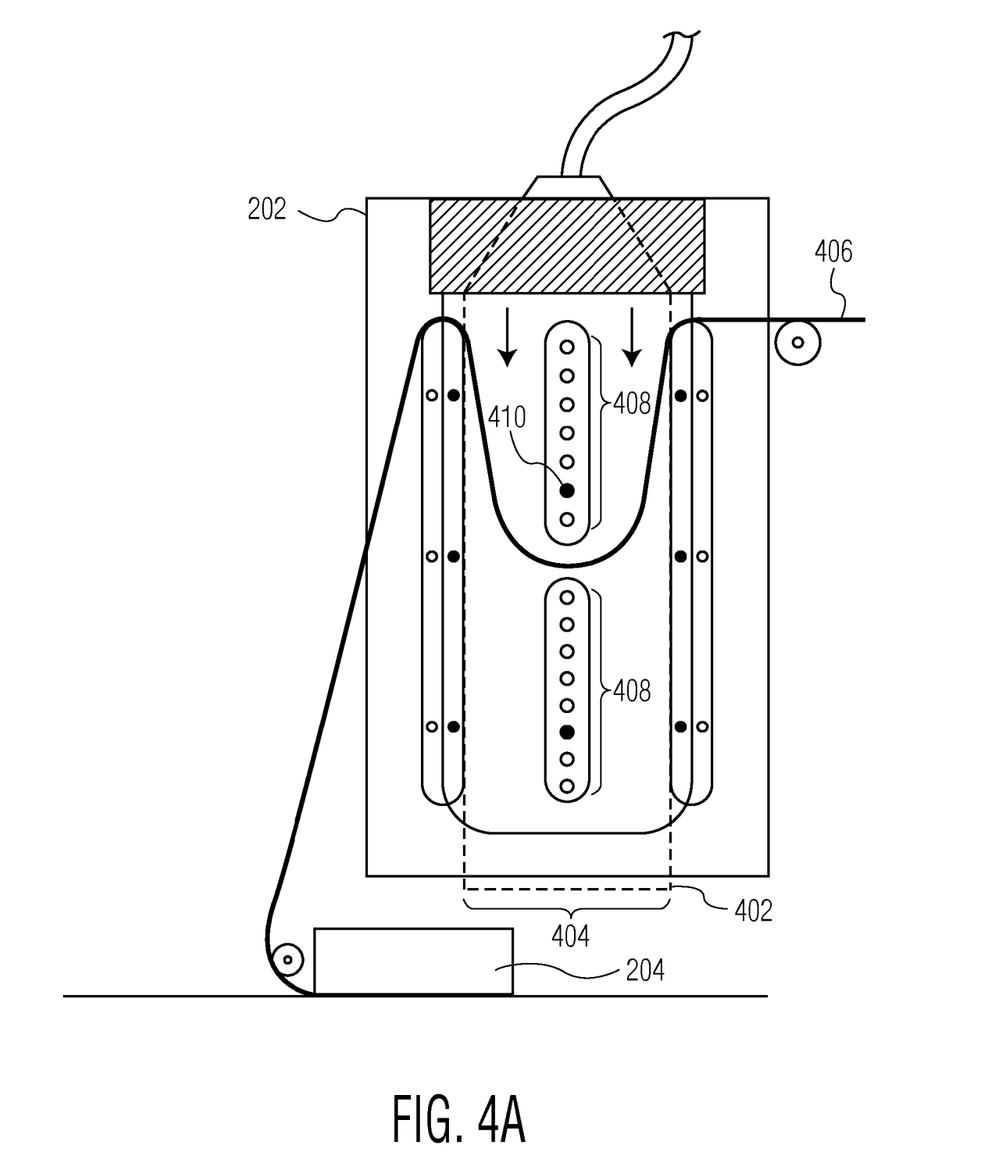
FIGS. 4A-4C are expanded views of the air-guided cover tape feeder and the alignment tool of the tape-and-reel system of FIG. 2
Figure 4B:
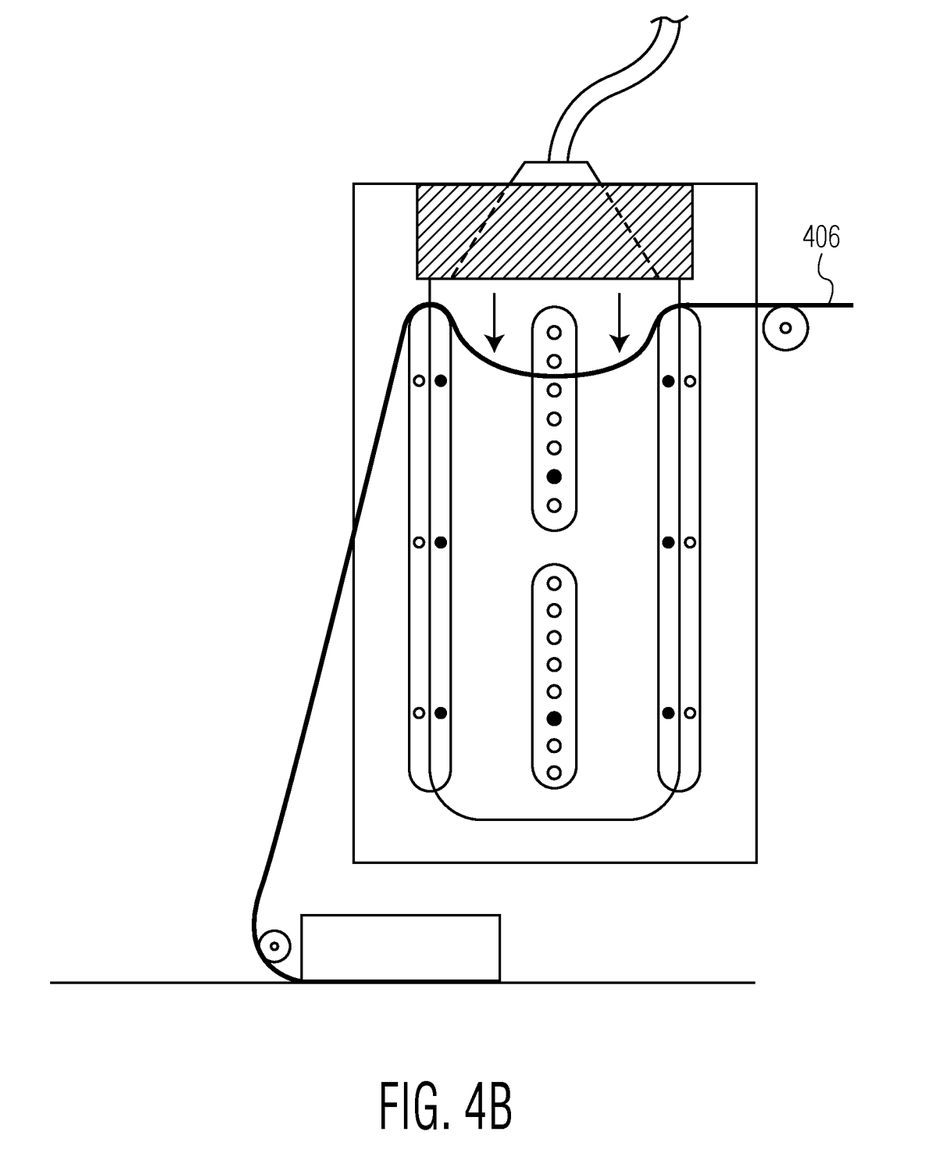
Figure 4C:
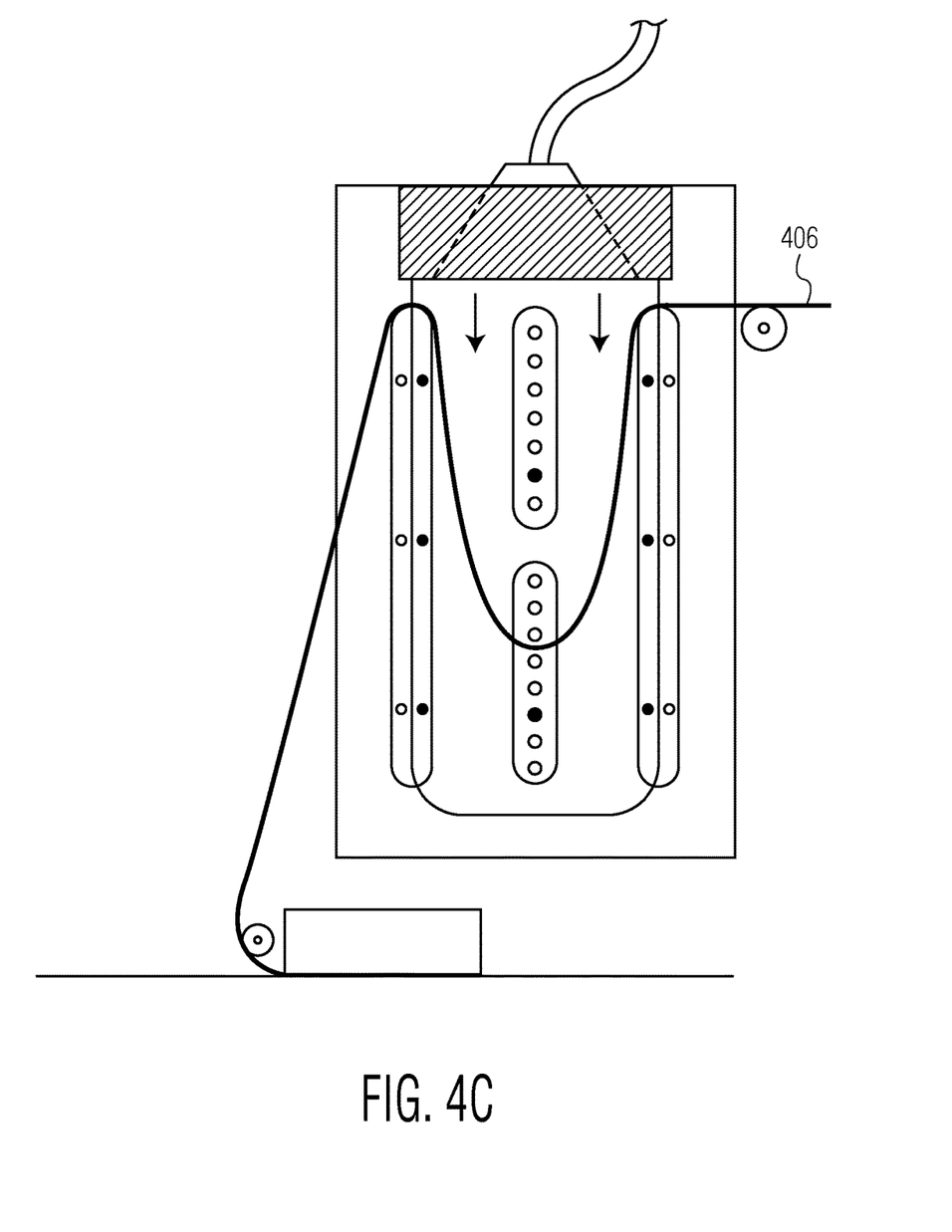

FIGS. 4A-4C are expanded views of the air-guided cover tape feeder 202 and the alignment tool 204 of the tape-and-reel system of FIG. 2. As shown in FIG. 4A, the air-guided cover tape feeder includes a vertical channel 402, having an upper and lower end, into which pressurized fluid can be forced through an opening 404. Cover tape 406 can be fed across the upper end of the vertical channel and the pressurized fluid can be forced into the upper end of the vertical channel (as indicated by the arrows) perpendicular to a major surface of the cover tape in order to hold tension on slack in the feed of cover tape by forcing a loop of cover tape into the vertical channel. In an embodiment, slack is a loop of cover tape in excess of the amount of cover tape immediately needed by the alignment tool. For example, if 50 mm of cover tape is unreeled from the cover tape reel, but the alignment tool only needs 10 mm to tape-in a component, the remaining 40 mm of unreeled cover tape makes up the slack. In an embodiment, the pressurized fluid applies pressure on the cover to force the slack in a downward direction (the direction indicated by the arrows) in the channel. In an embodiment, pressurized fluid is supplied at a rate of 6 standard cubic feet per hour (SCFH) from the factory supply at 6 Bar. As the slack is used up (e.g., by taping-in components), more slack is introduced by driving more tape from the cover tape reel and applying tension to the slack in the feed of cover tape. In an embodiment, slack can be introduced into the feed of cover tape continuously, at intervals (e.g., every 100 ms or every 5 tape-ins), or as needed (e.g., manually or sensor driven). In an embodiment, an optical sensor system 408 is located along the vertical channel and adjusted so that a desired slack level is selected as indicated by the indicator 410. In an embodiment, the sensor optical sensor system is comprised of a single sensor. When tape crosses the sensor, the cover tape reel drives more tape from the cover tape reel for a certain fixed time. In another embodiment, the optical sensor system is comprised of several optical sensors. In an embodiment, the cover tape reel can be configured to drive more tape from the cover tape reel based on software settings for different applications and index speeds. For example, if a faster index speed is used, the cover tape reel may be configured to drive tape from the cover tape reel for a longer fixed time than when a slower index speed is used.

FIGS. 4A-4C illustrate three levels of slack: low slack (FIG. 4B), desired slack (FIG. 4A), and high slack (FIG. 4C). If the slack level in the feed of cover tape 406 reaches the low slack level, as illustrated in FIG. 4B, then more slack can be introduced in the feed of cover tape by unreeling more cover tape and driving the cover tape into the vertical channel. If the slack level in the feed of cover tape 406 reaches the high slack level, as indicated by FIG. 4C, then the tape-and-reel system can stop driving cover tape to allow for some of the slack to be used up. By introducing slack in the feed of cover tape and holding tension on the slack using pressurized fluid, force variations, movement, and friction that can produce alignment errors are reduced from the levels at which they would occur when using a mechanical tension system to hold slack in the feed of cover tape. Thus, alignment errors can be reduced.

Figure 5A:
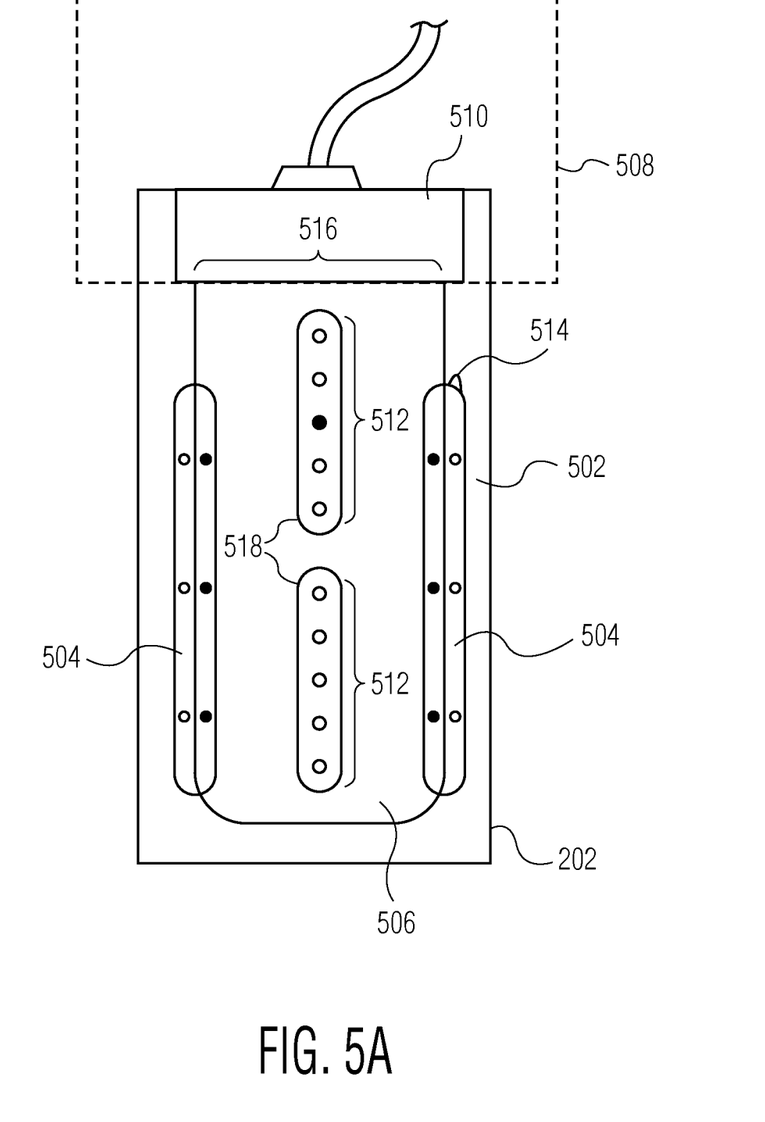
FIG. 5A is a perspective view of an embodiment of an air-guided cover tape feeder.

FIG. 5A is a perspective view of an embodiment of the air-guided cover tape feeder 202. In the embodiment of FIG. 5A, the air-guided cover tape feeder is formed by a rear panel 502, two spacers 504, a cover plate 506, an optical sensor system 512, and a pressurized fluid interface 508 with a pressurized fluid outlet nozzle 510. The two spacers are spaced horizontally apart to create a vertical channel 516 into which pressurized fluid (e.g., air) from the pressurized fluid outlet of the pressurized fluid interface can be forced and optical sensors in the optical sensor system are configured along the vertical channel. In an embodiment, the cover plate has openings 518 that align with the optical sensor system such that the cover plate does not cause reflections that could trigger the optical sensors.

Figure 5B:
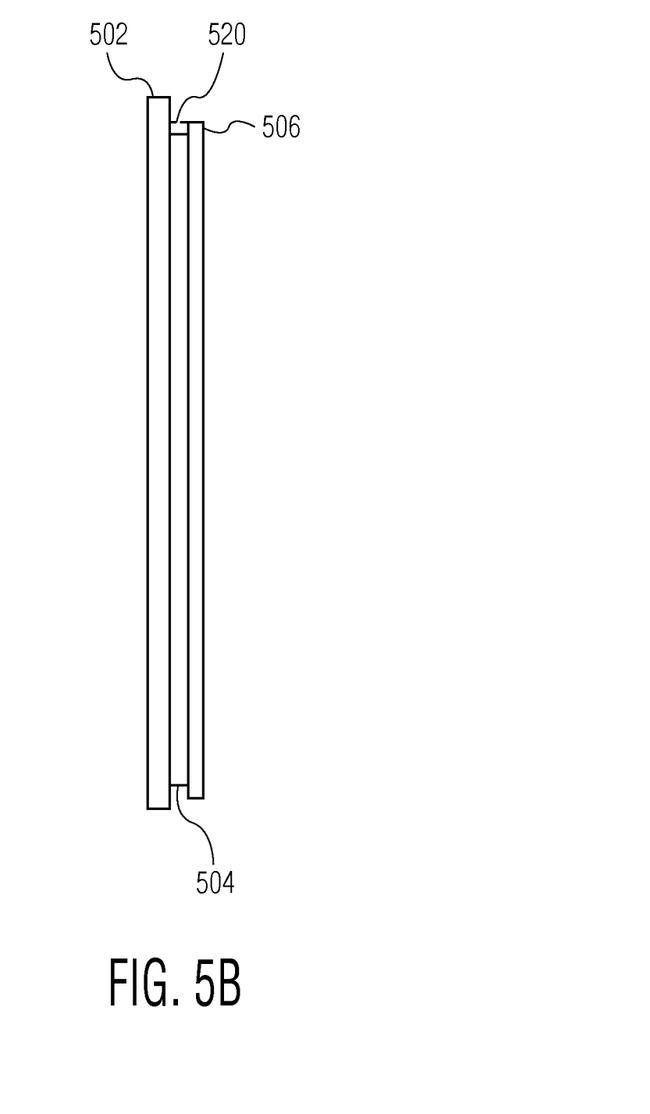
FIG. 5B is a profile view of the embodiment of the air-guided cover tape feeder of FIG. 5A.

FIG. 5B is a profile view of the embodiment of the air-guided cover tape feeder of FIG. 5A. In the embodiment of 5B, the rear panel 502 of the air-guided cover tape feeder is separated from the cover plate 506 by the two spacers 504, the separation forming a channel 520 over the spacers through which cover tape can pass. In an embodiment, the spacers have a thickness slightly larger than the width of the cover tape such that the channel is wide enough for the cover tape to pass through. For example, in order to use 5.5 mm cover tape (e.g., for use with 8 mm carrier tape), the air-guided cover tape feeder would use spacers with a thickness of 5.7 mm to create a 5.7 mm channel through which the cover tape can pass or, in order to use 9.5 mm cover tape (e.g., with 12 mm carrier tape), the air-guided cover tape feeder would use spacers with a thickness of 9.7 mm to create a 9.7 mm channel through which the cover tape can pass.

Figure 6:
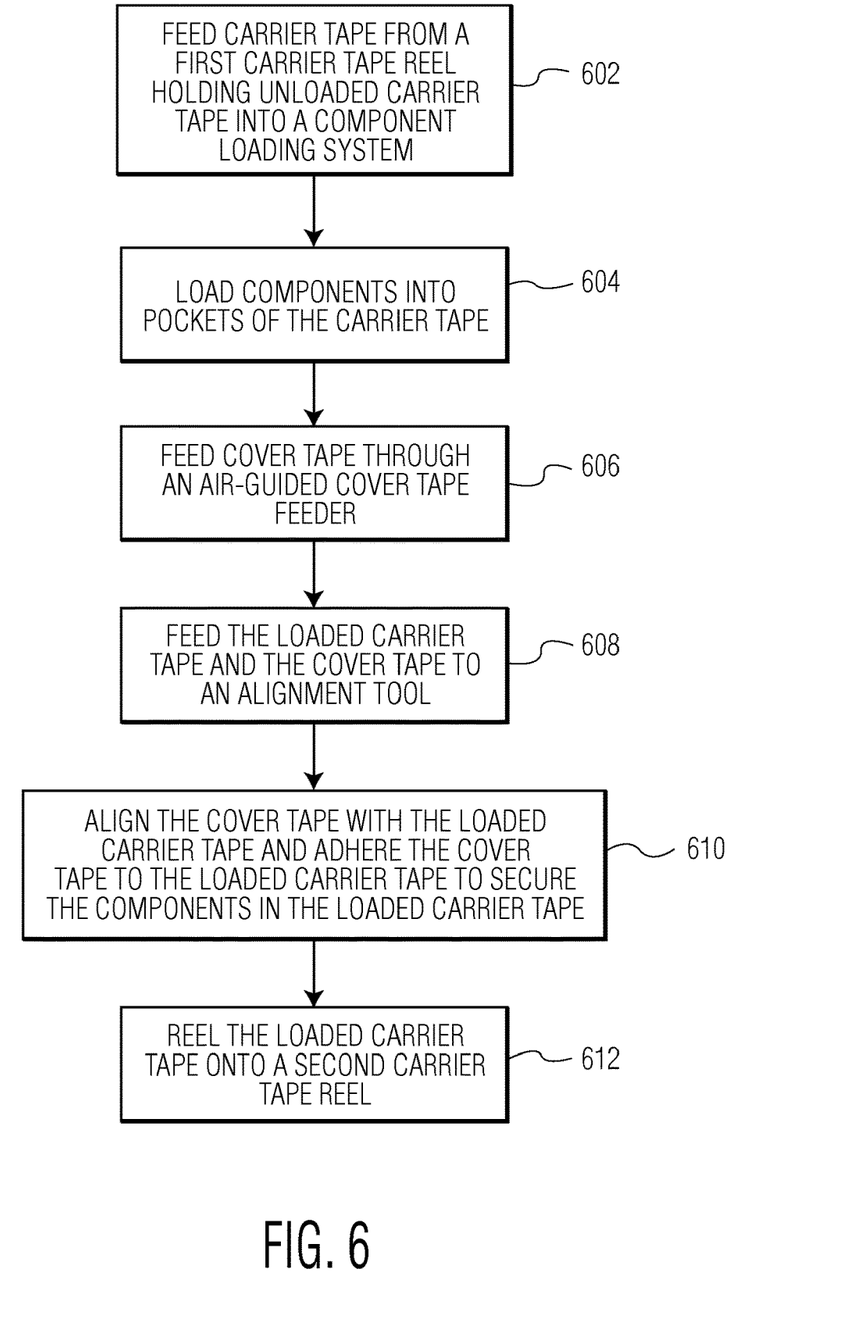
FIG. 6 is a process flow diagram of a method for processing components using a tape-and-reel system.

FIG. 6 is a process flow diagram of a method for processing components using a tape-and-reel system. At block 602, cover tape is fed from a first carrier tape reel holding unloaded carrier tape into a component loading system. At block 604, components are loaded into the pockets of the carrier tape. At block 606, cover tape is fed through an air-guided cover tape feeder. At block 608, the loaded carrier tape and the cover tape are fed to an alignment tool. At block 610, the alignment tool aligns the cover tape with the loaded carrier tape and adheres the cover tape to the loaded carrier tape to secure the components in the loaded carrier tape. At block 612, the loaded carrier tape is reeled onto a second carrier tape reel.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A tape-and-reel system for processing circuit components, the tape-and-reel system comprising:
   a first carrier tape reel for holding an unloaded carrier tape;

a circuit component loading system for loading circuit components into a plurality of pockets of the unloaded carrier tape to form a loaded carrier tape;

an air-guided cover tape feeder through which a cover tape travels, the air-guided cover tape feeder comprising:

a vertical channel over which the cover tape travels, wherein the cover tape is fed horizontally across the top of the upper end of the vertical channel; and a pressurized fluid interface positioned over the upper end of the vertical channel, wherein the carrier tape is fed horizontally across the upper end of the vertical channel, and wherein the pressurized fluid interface is configured to inject externally pressurized fluid through the pressurized fluid interface perpendicular to a major surface of the cover tape being horizontally across the upper end of the vertical channel and into the channel to apply pressure via the pressurized fluid on the cover tape to hold tension on a slack of the cover tape, the slack being a loop of cover tape in excess of the amount of cover tape needed by an alignment tool;

wherein the alignment tool is configured to guide the cover tape into alignment with the loaded carrier tape and adhere the cover tape to the loaded carrier tape to secure the circuit components into the loaded carrier tape; and a second carrier tape reel configured to hold the loaded carrier tape.

2. The tape-and-reel system of claim 1, wherein the pressurized fluid interface is configured to apply the pressure via the pressurized fluid on the cover tape to force the cover tape in a downward direction in the channel.

3. The tape-and-reel system of claim 1, wherein the pressurized fluid interface comprises at least one pressurized fluid outlet configured to inject the pressurized fluid into the channel.

4. The tape-and-reel system of claim 3, wherein the pressurized fluid outlet and the channel are configured to inject the pressurized fluid into the channel perpendicular to a major surface of the cover tape.

5. The tape-and-reel system of claim 3, wherein the pressurized fluid outlet is configured to continually inject the pressurized fluid into the channel to hold tension on the cover tape.

6. The tape-and-reel system of claim 1, wherein the air-guided cover tape feeder comprises:

a rear panel;

at least two spacers coupled to the rear panel; and a cover plate having a plurality of openings;

wherein the cover plate is separated from the rear panel by the at least two spacers such that cover tape can pass over the spacers between the rear panel and the cover plate; and wherein the at least two spacers are spaced horizontally apart to create a vertical channel into which the pressurized fluid can be injected perpendicular to a major surface of the cover tape.

7. The tape-and-reel system of claim 6, wherein the air-guided cover tape feeder further comprises an optical sensor system positioned along the rear panel and behind the plurality of openings in the cover plate.

8. A method for processing circuit components using a tape-and-reel system, the method comprising:

feeding carrier tape from a first carrier tape reel holding unloaded carrier tape into a circuit component loading system;

loading each of a plurality of circuit components into a plurality of respective pockets of the carrier tape to form a loaded carrier tape;

feeding a cover tape through an air-guided cover tape feeder, the air-guided cover tape feeder comprising:

a vertical channel over which the cover tape travels, wherein the cover tape is fed horizontally across the top of the upper end of the vertical channel, and a pressurized fluid interface positioned over the upper end of vertical channel, wherein the carrier tape is fed across the upper end of the vertical channel, wherein the pressurized fluid interface is configured to inject externally pressurized fluid through the pressurized fluid interface perpendicular to a major surface of the cover tape being fed horizontally across the upper end of the vertical channel and into the vertical channel over which the cover tape horizontally travels to apply pressure via the pressurized fluid on the major surface of the cover tape to hold tension on a slack of the cover tape, the slack being a loop of cover tape in excess of the amount of cover tape needed by an alignment tool;

feeding the loaded carrier tape and the cover tape to the alignment tool;

aligning the cover tape with the loaded carrier tape and adhering the cover tape to the loaded carrier tape to secure the circuit components into the loaded carrier tape; and reeling the loaded carrier tape onto a second carrier tape reel.

9. The method of claim 8, wherein the pressurized fluid is continually injected into the channel to hold tension on the cover tape.

10. The method of claim 8, wherein the feeding of the cover tape through an air-guided cover tape feeder is performed in response to an optical detector failing to detect cover tape within the air-guided cover tape feeder.

* * * * *